(12) United States Patent
Gao et al.

(10) Patent No.: US 12,075,641 B2
(45) Date of Patent: Aug. 27, 2024

(54) ORGANIC ELECTROLUMINESCENT DEVICE AND METHOD FOR PREPARING THE SAME

(71) Applicants: Chengdu BOE Optoelectronics Technology Co., Ltd., Chengdu (CN); BOE Technology Group Co., Ltd., Beijing (CN)

(72) Inventors: Yingchang Gao, Beijing (CN); Yali Huang, Beijing (CN); Qiannan Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 428 days.

(21) Appl. No.: 17/488,518

(22) Filed: Sep. 29, 2021

(65) Prior Publication Data

US 2022/0271247 A1    Aug. 25, 2022

(30) Foreign Application Priority Data

Feb. 24, 2021    (CN) .......................... 202110207824.6

(51) Int. Cl.
*H10K 50/11*    (2023.01)
*H10K 50/16*    (2023.01)
(Continued)

(52) U.S. Cl.
CPC ............ *H10K 50/11* (2023.02); *H10K 50/16* (2023.02); *H10K 50/81* (2023.02); *H10K 50/82* (2023.02); *H10K 2101/40* (2023.02)

(58) Field of Classification Search
CPC .... H10K 2101/40; H10K 50/11; H10K 50/81; H10K 50/82; H10K 50/157; H10K 59/00; H10K 71/00
See application file for complete search history.

(56) References Cited

U.S. PATENT DOCUMENTS 6,420,031 B1 *   7/2002   Parthasarathy ........ C09K 11/06
                                                        313/506
7,365,360 B2    4/2008   Kang et al.
(Continued)

FOREIGN PATENT DOCUMENTS

CN            1906777 A      1/2007
CN          110854278 A      2/2020
(Continued)

OTHER PUBLICATIONS

Second Office Action, including Search Report, for Chinese Patent Application No. 202110207824.6, dated Mar. 1, 31, 2023, 6 pages.
(Continued)

*Primary Examiner* — Mamadou L Diallo
(74) *Attorney, Agent, or Firm* — Westman, Champlin & Koehler, P.A.

(57) ABSTRACT

The present disclosure provides an organic electroluminescent device comprising: a cathode; an anode; an N-type organic semiconductor between the cathode and the anode; and a P-type organic semiconductor between the N-type organic semiconductor and the anode and in contact with the N-type organic semiconductor, wherein the P-type organic semiconductor has a LUMO energy level between a LUMO energy level and a HOMO energy level of the N-type organic semiconductor, and an energy level difference between the LUMO energy level of the N-type organic semiconductor and the LUMO energy level of the P-type organic semiconductor corresponds to an electron transition luminescence spectral range in a wavelength range between near-infrared to ultraviolet.

19 Claims, 4 Drawing Sheets

(51) Int. Cl.
    *H10K 50/81*    (2023.01)
    *H10K 50/82*    (2023.01)
    *H10K 101/40*    (2023.01)

(56) References Cited

U.S. PATENT DOCUMENTS

| | | | |
|---|---|---|---|
| 7,821,001 B2 | 10/2010 | Kang et al. | |
| 9,666,817 B2* | 5/2017 | Kim | H10K 30/20 |
| 2005/0255334 A1* | 11/2005 | Kang | H10K 50/81 |
| | | | 428/690 |
| 2008/0272369 A1 | 11/2008 | Kang et al. | |
| 2011/0079774 A1* | 4/2011 | Kang | H05B 33/14 |
| | | | 257/40 |
| 2012/0248421 A1* | 10/2012 | Yamazaki | H10K 50/13 |
| | | | 257/E51.024 |
| 2014/0084274 A1* | 3/2014 | Yamazaki | H10K 50/11 |
| | | | 257/40 |
| 2017/0288162 A1* | 10/2017 | Akiyama | H10K 50/11 |
| 2018/0198098 A1* | 7/2018 | Cheng | H10K 59/32 |
| 2018/0358562 A1* | 12/2018 | Takita | H05B 47/11 |
| 2019/0040314 A1* | 2/2019 | Ito | H10K 50/11 |
| 2020/0220096 A1* | 7/2020 | Zheng | H10K 50/00 |
| 2021/0066628 A1* | 3/2021 | Park | H10K 30/80 |
| 2021/0070740 A1* | 3/2021 | Yoo | H10K 85/625 |
| 2021/0351357 A1* | 11/2021 | Min | H10K 85/626 |
| 2022/0006027 A1* | 1/2022 | Forrest | H10K 85/6576 |
| 2022/0158110 A1* | 5/2022 | Jeon | H10K 50/19 |
| 2022/0271260 A1* | 8/2022 | Forrest | H10K 50/818 |

FOREIGN PATENT DOCUMENTS

| | | | | |
|---|---|---|---|---|
| CN | 111864087 A | * | 10/2020 | C09K 11/02 |
| JP | 2006303456 A | * | 11/2006 | H01S 5/36 |
| WO | WO-2017199163 A1 | * | 11/2017 | H01L 27/322 |

OTHER PUBLICATIONS

First Office Action, including Search Report, for Chinese Patent Application No. 202110207824.6, dated Aug. 2, 2022, 21 pages.

* cited by examiner

ORGANIC ELECTROLUMINESCENT DEVICE AND METHOD FOR PREPARING THE SAME

CROSS REFERENCE TO RELATED APPLICATION

The present disclosure claims a priority of Chinese Patent Application No. 202110207824.6, filed on Feb. 24, 2021, which is incorporated herein by reference in its entirety.

TECHNICAL FIELD

The present disclosure relates to the technical field of organic electroluminescent device (OLED), and particularly to an organic electroluminescent device and a method for preparing the same.

BACKGROUND

Organic electroluminescent materials may be classified into fluorescent organic luminescent materials and phosphorescent organic luminescent materials. Phosphorescent organic luminescent materials have an internal quantum efficiency up to 100% due to the capability of utilizing both singlet and triplet excitons. However, efficient phosphorescent materials predominantly congregate in complexes of noble metals iridium (Ir) and platinum (Pt), which suffer from the problems such as high cost and shortage of noble metal resources. This is disadvantageous for commercial applications. In contrast, fluorescent organic luminescent materials have inexpensive molecules, and may be obtained from a wide range of sources. However, in an electroluminescence process, the ratio of singlet excitons to triplet excitons generated is 1:3 under the limitation of spin statistics. Since the transition of triplet excitons to emit light is forbidden, only 25% of the excitons may be utilized, such that the theoretical upper limit of the internal quantum efficiency of the fluorescent organic luminescent material is only 25%. The low internal quantum efficiency in turn results in low luminescence efficiency of the luminescent device prepared from such a material. For example, assuming that the light extraction efficiency of the device is about 20%, the upper limit of the external quantum efficiency of the device is only 5%. The low luminescence efficiency of the device limits the commercial promotion and application of organic luminescent materials.

P-N junction luminescent semiconductor devices emit light by the recombination of an electron from the N area and a hole from the P area. In existing organic semiconductor-based P-N junction luminescent devices, electrons come from the LUMO energy level of the N-type organic semiconductor, and holes come from the HOMO energy level of the P-type organic semiconductor. Since the electron-hole recombination is also limited by the spin state of the electrons in the HOMO energy level of the P-type organic semiconductor, the quantum efficiency and the luminescence efficiency are low as well.

There is a need for improvement in the luminescence efficiency of a fluorescent organic luminescent material-based electroluminescent device.

SUMMARY

In an aspect, the present disclosure provides an organic electroluminescent device comprising:
a cathode;
an anode;
an N-type organic semiconductor between the cathode and the anode; and
a P-type organic semiconductor between the N-type organic semiconductor and the anode and in contact with the N-type organic semiconductor,
wherein the P-type organic semiconductor has a LUMO energy level between a LUMO energy level and a HOMO energy level of the N-type organic semiconductor, and an energy level difference between the LUMO energy level of the N-type organic semiconductor and the LUMO energy level of the P-type organic semiconductor corresponds to an electron transition luminescence spectral range in a wavelength range between near-infrared to ultraviolet.

Optionally, the LUMO energy level of the N-type organic semiconductor is higher than the LUMO energy level of the P-type organic semiconductor by 1.6 eV or more.

Optionally, the energy level difference between the LUMO energy level of the N-type organic semiconductor and the LUMO energy level of the P-type organic semiconductor corresponds to an electron transition luminescence spectral range in a wavelength range of visible light.

Optionally, the LUMO energy level of the P-type organic semiconductor is in a range from −4.0 eV to −6.0 eV.

Optionally, the P-type organic semiconductor is selected from:
2,3,6,7,10,11-hexacyano-1,4,5,8,9,12-hexaazabenzophenanthrene,
2,3,5,6-tetrafluoro-7,7',8,8'-tetracyanoquinodimethane, and
2,5-difluoro-3,6,7,7',8,8'-hexacyanoquinodimethane.

Optionally, the HOMO energy level of the N-type organic semiconductor is lower than the LUMO energy level of the P-type organic semiconductor by 0.3 eV or more.

Optionally, the organic electroluminescent device further comprises:
a carrier transporter between the N-type organic semiconductor and the cathode and in contact with the N-type organic semiconductor, wherein the carrier transporter comprises an organic semiconductor having a HOMO energy level, which exhibits an energy level difference within ±0.3 eV with respect to the HOMO energy level of the N-type organic semiconductor.

Optionally, the organic semiconductor having a HOMO energy level, which exhibits an energy level difference within ±0.3 eV with respect to the HOMO energy level of the N-type organic semiconductor, is a bipolar carrier transport organic semiconductor.

Optionally, the bipolar carrier transport organic semiconductor comprises both an electron donor unit and an electron acceptor unit.

Optionally, the organic semiconductor having a HOMO energy level, which exhibits an energy level difference within ±0.3 eV with respect to the HOMO energy level of the N-type organic semiconductor, is a hole transport organic semiconductor.

Optionally, the carrier transporter is a carrier transport layer with a thickness of 10 nm or less.

Optionally, the carrier transporter is an N-type semiconductor doped with the hole transport organic semiconductor at a concentration of 5% or less.

In another aspect, the present disclosure provides a method for preparing the above-mentioned organic electroluminescent device, comprising:

fabricating the N-type organic semiconductor and the P-type organic semiconductor in contact with each other by a vacuum evaporation process, a spin coating process or an inkjet printing process.

In yet another aspect, the present disclosure provides a display panel comprising the above-mentioned organic electroluminescent device.

In yet another aspect, the present disclosure provides a display device comprising the above-mentioned display panel.

DETAILED DESCRIPTION

Figure 1:
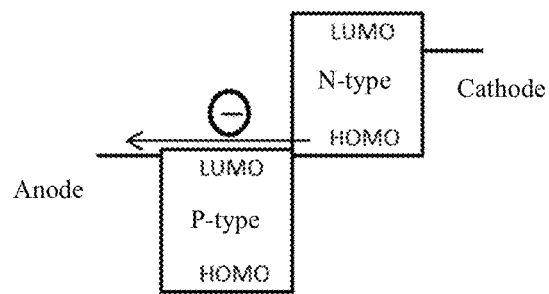
FIG. 1 is a schematic diagram showing the energy level relationship according to an embodiment of the present disclosure.

In an electroluminescence process of single fluorescent organic material, the ratio of singlet excitons to triplet excitons formed in the material is 1:3 under the limitation of spin statistics. Since the transition of triplet excitons to a ground state is forbidden and no fluorescence may be emitted, only 25% of the excitons may be utilized, such that the theoretical upper limit of the internal quantum efficiency of the fluorescent organic luminescent material is only 25%. This in turn results in low luminescence efficiency of a fluorescent organic luminescent material-based electroluminescent device.

In existing organic semiconductor-based P-N junction luminescent devices, electrons come from the LUMO energy level of the N-type organic semiconductor, and holes come from the HOMO energy level of the P-type organic semiconductor. Since the electron-hole recombination is also limited by the spin state of the electrons in the HOMO energy level of the P-type organic semiconductor, the quantum efficiency and the luminescence efficiency are low as well.

In order to solve the above-mentioned problems, the present disclosure proposes a novel structure of an electroluminescent device, in which the above-mentioned problem is solved by providing a P-type organic semiconductor having a sufficiently low LUMO energy level in contact with an N-type organic semiconductor fluorescent organic luminescent material.

The present disclosure provides an organic electroluminescent device comprising:
  a cathode;
  an anode;
  an N-type organic semiconductor between the cathode and the anode; and
  a P-type organic semiconductor between the N-type organic semiconductor and the anode and in contact with the N-type organic semiconductor,
  wherein the P-type organic semiconductor has a LUMO energy level between a LUMO energy level and a HOMO energy level of the N-type organic semiconductor, and an energy level difference between the LUMO energy level of the N-type organic semiconductor and the LUMO energy level of the P-type organic semiconductor corresponds to an electron transition luminescence spectral range in a wavelength range between near-infrared to ultraviolet.

The organic electroluminescent device of the present disclosure is also based on a P-N junction formed from a P-type organic semiconductor and an N-type organic semiconductor, but differs from existing devices in that the device of the present disclosure emits light based on the transition of electrons between the LUMO energy levels of those two organic semiconductors.

The anode and the cathode are used for injecting carriers to the organic electroluminescent device, wherein electrons flow into the device from the cathode, and flow out of the device from the anode.

The N-type organic semiconductor is located between the cathode and the anode. The N-type organic semiconductor functions to provide electrons in the luminescence due to the electron-hole recombination. The N-type organic semiconductor is an electron transport material, and facilitates the injection of electrons from the cathode.

Typically, the molecules of an organic semiconductor have a lowest unoccupied molecular orbital (LUMO) and a highest occupied molecular orbital (HOMO). When the electrons injected into the LUMO recombine with the holes generated in the HOMO to form excitons, the excitons may be de-excited and emit light radiatively. This process may be regarded as that the electrons injected into the LUMO radiatively transit to the HOMO energy level and emit light during the transition, where they recombine with holes. However, only singlet excitons may emit fluorescence during the transition, and only 25% of the injected electrons may form singlet excitons under the limitation of the rule of electron spin statistics, and the remaining 75% will form triplet excitons. For a fluorescent material, the transition from a triplet state to a ground state is forbidden, and the energy is typically released in a non-radiative manner, so that no light is emitted. Therefore, a conventional fluorescent electroluminescent device in which only an organic semiconductor is provided between a cathode and an anode has a low luminescence efficiency.

In contrast to the above-mentioned conventional fluorescent electroluminescent device, the electroluminescent device of the present disclosure further comprises a P-type organic semiconductor between the N-type organic semiconductor and the anode and in contact with the N-type organic semiconductor, wherein those two organic semiconductors form a P-N junction. Surprisingly, the P-type organic semiconductor provides an additional transition luminescence approach to the electrons injected into the LUMO of the N-type organic semiconductor, i.e., a transition from the LUMO of the N-type organic semiconductor to the LUMO of the P-type organic semiconductor in contact therewith.

The P-type organic semiconductor is selected, because it serves as a hole transport material, which facilitates the injection of holes from the anode.

In order to achieve luminescence, the P-type organic semiconductor and the N-type organic semiconductor need to have a certain energy level relationship. Specifically, the P-type organic semiconductor has a LUMO energy level between the LUMO energy level and the HOMO energy level of the N-type organic semiconductor, and the energy level difference between the LUMO energy level of the N-type organic semiconductor and the LUMO energy level of the P-type organic semiconductor corresponds to an electron transition luminescence spectral range in a wavelength range between near-infrared to ultraviolet. In the most general sense, the organic luminescent device of the present disclosure may achieve the emission of a light in the range from near-infrared to ultraviolet light by the transition from the LUMO of the N-type organic semiconductor to the LUMO of the P-type organic semiconductor in contact therewith.

On one hand, the LUMO energy level of the P-type organic semiconductor serves as a target energy level for the transition of the electrons injected into the LUMO of the N-type organic semiconductor, and thus needs to be lower than the LUMO energy level of the N-type organic semiconductor to achieve luminescence. On the other hand, the LUMO energy level of the P-type organic semiconductor also should not be lower than the HOMO energy level of the N-type organic semiconductor. Otherwise, the electrons injected into the LUMO of the N-type organic semiconductor will be more inclined to transit to its own HOMO energy level, because in this case, the electrons in the HOMO of the N-type organic semiconductor will migrate to the LUMO of the P-type organic semiconductor, such that holes are formed in the HOMO of the N-type organic semiconductor, providing transition sites for the electrons, while the energy level difference between the LUMO energy level and the HOMO energy level of the N-type organic semiconductor is less than that between the LUMO energy level of the N-type organic semiconductor and the LUMO energy level of the P-type organic semiconductor. Therefore, in the electroluminescent device of the present disclosure, the LUMO energy level of the P-type organic semiconductor is set between the LUMO energy level and the HOMO energy level of the N-type organic semiconductor.

In the -OLED device of the present disclosure based on a planar PN heterojunction, the luminescence center is located at the interface of the P-type/N-type semiconductors, and theoretically, the energy of the emitted light is related to the energy level difference between the LUMO of the N-type semiconductor and the LUMO of the P-type semiconductor. By selecting an appropriate energy level difference, the present disclosure may provide an electroluminescent device which emits a light in a wavelength range between near-infrared to ultraviolet. Preferably, in the present disclosure, the LUMO energy level of the N-type organic semiconductor is higher than the LUMO energy level of the P-type organic semiconductor by 1.6 eV or more. Thus, the emitted light may be in the range from visible light to ultraviolet light, which is a common luminescence range in OLEDs. Most preferably, in the present disclosure, the energy level difference between the LUMO energy level of the N-type organic semiconductor and the LUMO energy level of the P-type organic semiconductor corresponds to an electron transition luminescence spectral range in a luminescence wavelength range of visible light, more in particular, between 380 nm and 780 nm. The OLED, which emits a visible light, is suitable for use as a color light source in a display device.

As appropriate, one or more of the cathode, the anode, the N-type organic semiconductor and the P-type organic semiconductor may be made from a transparent material.

The electroluminescent device of the present disclosure makes use of the P-N junction theory to solve the problem of low luminescence efficiency in the organic luminescent device due to the limitation of spin statistics by appropriately selecting a P-type organic semiconductor material having a LUMO energy level suitable for the energy levels of a conventional N-type organic semiconductor material to form a P-N junction device together with the N-type organic semiconductor material. This may significantly improve the luminescence efficiency of the device and reduce the power consumption of the device. In the luminescent device of the present disclosure, the N-type organic semiconductor is an electron transport material, and the P-type organic semiconductor is a hole transport material. Hence, the structure of the device may be simplified to only comprise the N-type organic semiconductor and the P-type organic semiconductor between the cathode and the anode. As compared to a conventional multi-layer OLED device comprising electron/hole transport layers, electron/hole injection layers, and a light emitting layer, the device of the present disclosure may have a simpler structure and a lower cost.

Preferably, the LUMO energy level of the P-type organic semiconductor is in a range from −4.0 eV to −6.0 eV. For a common N-type organic semiconductor, the P-type organic semiconductor having a LUMO energy level within this range may provide a sufficiently low target LUMO energy level for transition. In other words, the P-type organic semiconductor having a LUMO energy level within in this range may be well matched with the HOMO energy level of a common N-type organic semiconductor. The HOMO energy level of the P-type organic semiconductor is not particularly limited, since it does not influence the luminescence of the device.

Preferably, the P-type organic semiconductor is selected from:
2,3,6,7,10,11-hexacyano-1,4,5,8,9,12-hexaazabenzophenanthrene (HAT-CN),
2,3,5,6-tetrafluoro-7,7',8,8'-tetracyanoquinodimethane (F4-TCNQ), and
2,5-difluoro-3,6,7,7',8,8'-hexacyanoquinodimethane (F2-HCNQ).

The molecular formula of HAT-CN is as shown below. The parameters for energy level are as follows: a LUMO energy level of about −5.2 eV and a HOMO energy level of about −9.4 eV.

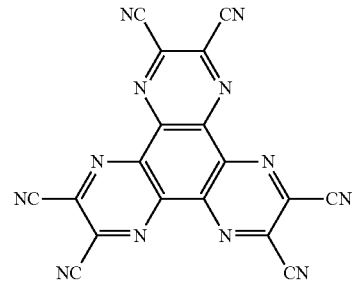 [SMILES: N#Cc1nc2c3nc(C#N)c(C#N)nc3c3nc(C#N)c(C#N)nc3c2nc1C#N]

The molecular formula of F4-TCNQ is as shown below. The parameter for enemy level is as follows: a LUMO energy level of −5.33 eV.

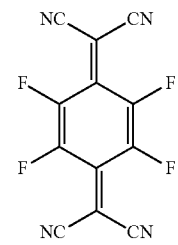 [SMILES: N#CC(C#N)=c1c(F)c(F)c(=C(C#N)C#N)c(F)c1F]

The molecular formula of F2-HCNQ is as shown below. The parameter for energy level is as follows: a LUMO energy level of −5.59 eV.

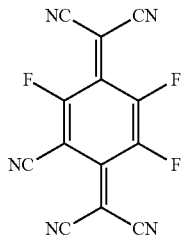 [SMILES: N#CC(C#N)=c1c(F)c(F)c(=C(C#N)C#N)c(C#N)c1F]

The above-mentioned exemplary P-type organic semiconductor has a sufficiently low LUMO energy level, and has a good interface compatibility with a common N-type organic semiconductor.

N-type organic semiconductor may be selected from common electron transport materials in the organic luminescence field. Available examples of the electron transport material suitable for use as the N-type organic semiconductor includes, but not limited to: Bephen, TPBi, Alq3, Liq, OXD-7, TAZ and so on, with the molecular formulas as shown below.

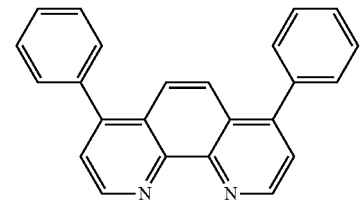

Bephen

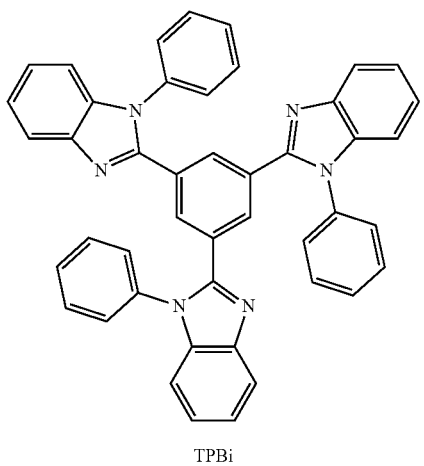

TPBi

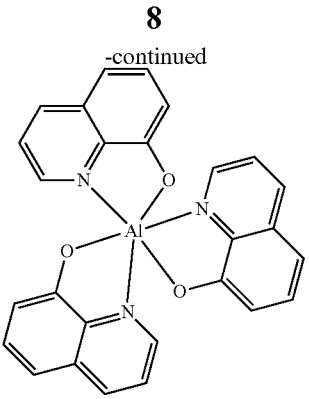

Alq3

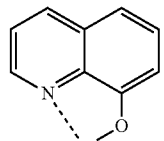

Liq

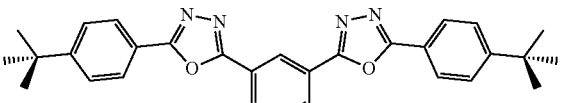

OXD-7

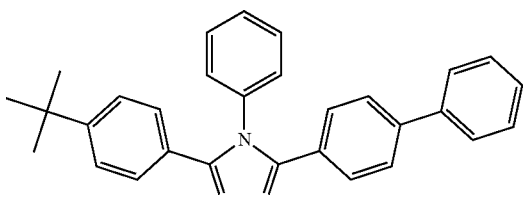

TAZ

The material of the cathode may be selected from metal materials having a low work function, such as Al, Mg, Ca or an alloy thereof. The material of the anode may be selected from materials having a high work function, in particular transparent materials, such as indium tin oxide (ITO).

FIG. 1 is a schematic diagram showing the energy level relationship according to an embodiment of the present disclosure. As shown in FIG. 1, an N-type organic semiconductor and a P-type organic semiconductor are connected in series between the cathode and the anode. The N-type organic semiconductor and the P-type organic semiconductor each have a LUMO energy level and a HOMO energy level. Here, the LUMO energy level of the P-type organic semiconductor is between the LUMO energy level and the HOMO energy level of the N-type organic semiconductor. The arrow and electron symbol in the figure indicate the direction of electron flow in the device. That is, electrons are injected into the LUMO energy level of the N-type organic semiconductor from the cathode of the device, and flow out from the anode. Meanwhile, holes are injected into the LUMO energy level of the P-type organic semiconductor from the anode, and transported between the LUMO energy level of the P-type organic semiconductor and the HOMO energy level of the N-type organic semiconductor.

FIGS. 2A-2D show two luminescence mechanisms according to the embodiment as shown in FIG. 1. The figures show the transport process of electrons between various materials and energy levels. Here, gray ellipses and arrows schematically represent electrons having a certain spin direction.

Figure 2A:
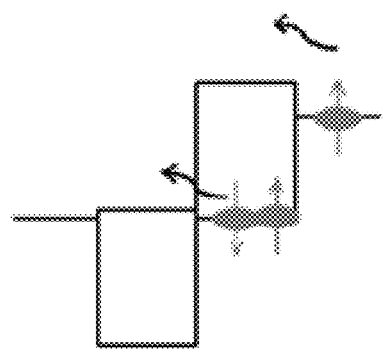
FIGS. 2A-2D show two luminescence mechanisms according to the embodiment as shown in FIG. 1.

FIG. 2A shows the initial state of electron transport, where a plurality of paired electrons with opposite spin directions (one pair is shown in the figure for example) occupy the HOMO energy level of the N-type organic semiconductor, and the LUMO energy level is empty. The LUMO energy level of the P-type organic semiconductor is also empty. The electron filling state of the HOMO energy level of the P-type organic semiconductor does not relate to the luminescence process of the present disclosure, and thus is not shown. In addition, there are electrons to be injected at the cathode of the electroluminescent device. As a voltage is applied to the electroluminescent device for injecting electrons, the electrons are transported from the cathode to the LUMO layer of the N-type organic semiconductor, and the electrons in the HOMO layer of the N-type organic semiconductor are transported to the LUMO layer of the P-type organic semiconductor. The arrows in FIG. 2A indicate the above-mentioned two electron transport processes.

Figure 2B:
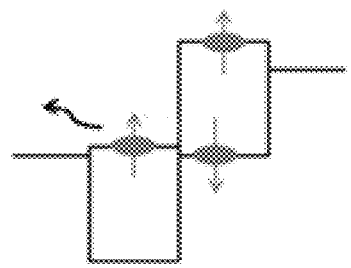
Figure 2C:
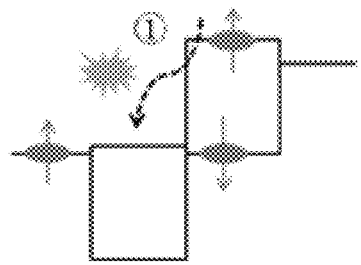

FIG. 2B and FIG. 2C show a first luminescence mechanism according to the embodiment as shown in FIG. 1. As shown in FIG. 2B, after the electron transport in FIG. 2A, the electrons in the LUMO layer of the P-type organic semiconductor are further transported to the anode immediately, and leave the P-type organic semiconductor, as indicated by the arrow, such that the LUMO of the P-type organic semiconductor is empty again at that time. Subsequently, as shown in FIG. 2C, the electrons injected into the LUMO energy level of the N-type organic semiconductor may transit to the LUMO energy level of the P-type organic semiconductor, and thus luminescence is achieved. The transition process is indicated by the dash line path ①.

Thus, as the electrons are injected into the LUMO energy level of the N-type organic semiconductor, the electrons in the HOMO energy level of the N-type organic semiconductor transit to the LUMO energy level of the P-type organic semiconductor. At that time, the empty LUMO energy level of the P-type organic semiconductor is occupied by the transited single electrons. The single electrons further transit to the anode, and the LUMO energy level becomes empty orbital again. At that time, whether the electrons injected into the LUMO energy level of the N-type organic semiconductor from the cathode spin upwards or spin downwards, the transition of them to the LUMO energy level of the P-type organic semiconductor is always allowed. The excitons generated by the recombination under such a luminescence mechanism may be regarded as doublet excitons (calculated according to spin multiplicity 2S+1, in which the spin quantum number of single electron is ½). Because the doublet excitons avoid the problem in the traditional electroluminescence theory that 75% of generated excitons are always triplet excitons which cannot emit light, the theoretical internal quantum efficiency thereof may be up to 100%.

Figure 2D:
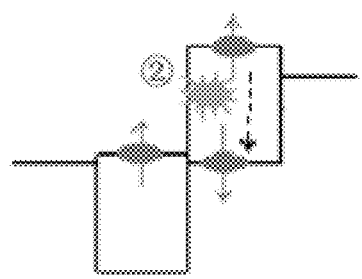

FIG. 2D shows a second luminescence mechanism according to the embodiment as shown in FIG. 1. In this luminescence mechanism, the luminescence due to transition is completed inside the N-type organic semiconductor. After the electrons are injected into the LUMO energy level of the N-type organic semiconductor and the electrons in the HOMO energy level of the N-type organic semiconductor move out in FIG. 2A, a portion of electrons in the LUMO energy level may directly transit to the HOMO energy level to emit light. That is, the electrons in the HOMO energy level of the N-type organic semiconductor jump to the LUMO energy level of the P-type organic semiconductor, while the holes are transported from the LUMO energy level of the P-type organic semiconductor to the HOMO energy level of the N-type organic semiconductor. At that time, the electrons in the LUMO energy level of the N-type organic semiconductor recombine with the holes in the HOMO energy level to form excitons, and the excitons are de-excited to emit light radiatively. The transition process is indicated by the dash line path ②. Nevertheless, such a luminescence mechanism is limited by the spin statistics rule, and since the ratio of singlet excitons to triplet excitons generated is 1:3, the theoretical internal quantum efficiency is only 25%.

In the electroluminescent device of the present disclosure, the above-mentioned two exciton generation approaches compete with each other. The proportions of two kinds of excitons are related to various factors. Assuming that the proportion of doublet excitons generated (Approach ①) is x (0≤x≤1), the proportion of excitons generated in Approach ② will be (1−x). In this case, the theoretical internal quantum efficiency is: $\eta_{inter}=x+0.25*(1-x)=0.75x+0.25$. Because x≤0, $\eta_{inter}$≤0.25. Therefore, the internal quantum efficiency of the electroluminescent device of the present disclosure is higher than that of a conventional fluorescent organic luminescent device.

The LUMO energy level of the P-type organic semiconductor may be either equal to or higher than the HOMO energy level of the N-type organic semiconductor. When the LUMO energy level of the P-type organic semiconductor is higher than the HOMO energy level of the N-type organic semiconductor, lights with different wavelengths or colors will be emitted in Approach ① and Approach ② due to different energy level differences. The electroluminescent device of the present disclosure may predominantly produce luminescence in Approach ①, because when the proportions of two kinds of excitons are the same, the amount of luminescence in Approach ① will be four times of that in Approach ② as calculated according to the above-mentioned equation. Of course, if the monochromaticity of the electroluminescent device is not particularly required, the luminescence in Approach ② may also be utilized.

When the electroluminescent device of the present disclosure is only used for luminescence, for example, as an OLED lighting source, the monochromaticity of the luminescence is not limited. Here, the luminescence may be achieved with high quantum efficiency and luminescence efficiency.

When the electroluminescent device of the present disclosure is used for applications which require the monochromaticity, for example, as a luminescent material in the pixels of a display device, the problem of monochromaticity may occur due to different wavelengths of the lights emitted in the above-mentioned two approaches. In addition to the process to filter off a minority of light emitted in Approach ② therein by using a color film layer or the like in combination, it is also possible that suitably matched N-type organic semiconductor material and P-type organic semiconductor material are selected such that the HOMO energy level of the selected N-type semiconductor material and the LUMO energy level of the P-type semiconductor material are as close as possible. This ensures that the emitted light is substantially a monochromatic light, although it has a slightly wide peak width at half height and a slightly poor color purity. Thus, the light emitted in Approach ② may also be utilized. Optimally, the above-mentioned two energy levels are the same, which may achieve a monochromatic luminescence.

Another process to improve the monochromaticity of luminescence is to reduce the proportion of light emitted in Approach ② and increase the proportion of light emitted in Approach ① as much as possible. In addition to increasing the monochromaticity of luminescence, this process is advantageous for increasing the luminescence efficiency of the entire device due to high quantum efficiency of luminescence in Approach ①.

As may be seen from the above-mentioned principle, the magnitude of the internal quantum efficiency of the device of the present application depends on the proportion of excitons in Approach ①. The higher the proportion of doublet excitons, the higher the internal quantum efficiency of the device is. If all the excitons are generated in Approach ① in the device (i.e., x=1), the internal quantum efficiency may be theoretically up to 100%. Therefore, the structure of the device may be optimized, to increase the proportion of the excitons generated in Approach ① the device as much as possible.

In a preferred embodiment, the above-mentioned proportion is increased by setting and choosing the HOMO energy level of the N-type organic semiconductor. Specifically, a HOMO energy level of the N-type organic semiconductor material lower than the LUMO energy level of the P-type organic semiconductor as much as possible is chosen. More specifically, the LUMO energy level of the P-type organic semiconductor is higher than the HOMO energy level of the N-type organic semiconductor by 0.3 eV or more.

Figure 3A:
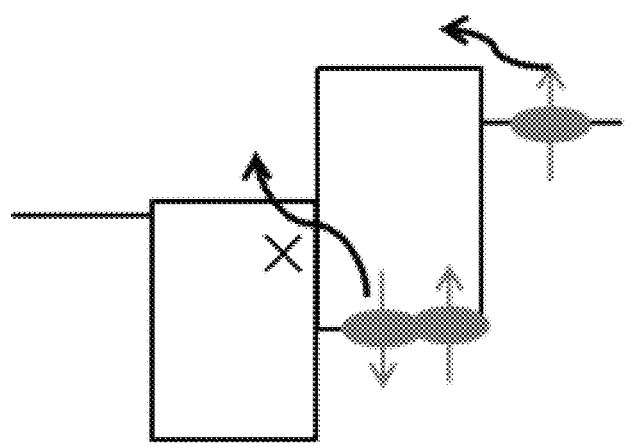
FIGS. 3A-3B show a luminescence mechanism according to another embodiment of the present disclosure.
Figure 3B:
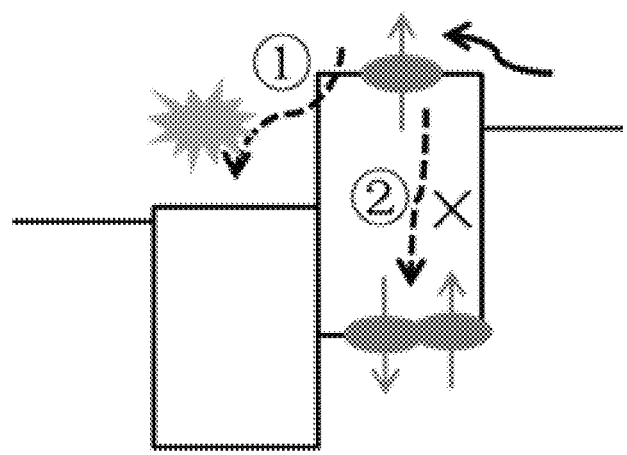

FIGS. 3A-3B show a luminescence mechanism according to another embodiment of the present disclosure, where the LUMO energy level of the P-type organic semiconductor is higher than the HOMO energy level of the N-type organic semiconductor by 0.3 eV or more, which is schematically indicated by a larger difference between two energy levels in the figures. Here, the energy gap between the HOMO energy level of the N-type organic semiconductor and the LUMO energy level of the P-type organic semiconductor is large enough, so that the transition of the electrons in the HOMO energy level of the N-type organic semiconductor to the LUMO energy level of the P-type organic semiconductor during the operation of the device may be effectively prevented (as indicated by the symbol x in FIG. 3A). Thus, the concentration of the holes in the HOMO energy level of the N-type organic semiconductor is significantly reduced, such that as many as possible of the electrons injected into the N-type organic semiconductor transit to the LUMO energy level of the P-type organic semiconductor in contact therewith (as indicated by Approach ① in FIG. 3B), thereby generating doublet excitons by recombination at the interface between two layers of materials and in turn, the excitons are de-excited and emit light radiatively. The transition from the LUMO energy level to the HOMO energy level in the N-type organic semiconductor will be significantly reduced (as indicated by the symbol x in Approach ② in FIG. 3B). In this embodiment, the quantum efficiency may be much more than 25%. When the difference between the LUMO energy level of the P-type organic semiconductor and the HOMO energy level of the N-type organic semiconductor is large enough, the transition of the electrons in the HOMO energy level of the N-type organic semiconductor to the LUMO energy level of the P-type organic semiconductor may even be almost totally prevented, such that the internal quantum efficiency of the device may be up to 100%.

The above-mentioned preferred embodiment facilitates the HOMO of the N-type organic semiconductor maintaining filled as much as possible and minimizes the holes therein by preventing the electrons in the HOMO of the N-type organic semiconductor from leaving, thereby reducing the proportion of light emitted by transition in Approach ②. In another preferred embodiment, the HOMO of the N-type organic semiconductor maintaining filled as much as possible may be facilitated and the holes therein may be minimized by timely supplementing electron carriers to the HOMO energy level of the N-type organic semiconductor or timely removing the holes in the HOMO energy level of the N-type organic semiconductor, thereby reducing the proportion of light emitted by transition in Approach ②. Specifically, a carrier transporter between the N-type organic semiconductor and the cathode and in contact with the N-type organic semiconductor is additionally provided in the electroluminescent device, wherein the carrier transporter comprises an organic semiconductor having a HOMO energy level, which exhibits an energy level difference within ±0.3 eV with respect to the HOMO energy level of the N-type organic semiconductor. The organic semiconductor having a HOMO energy level, which exhibits an energy level difference within ±0.3 eV with respect to the HOMO energy level of the N-type organic semiconductor, is an organic semiconductor different from the N-type organic semiconductor. When the energy level difference is within the above-mentioned range, the holes may spontaneously migrate between the HOMO energy levels of those two materials. Thus, the holes in the HOMO energy level of the N-type organic semiconductor may timely leave the N-type organic semiconductor and enter the above-mentioned organic semiconductor, without participating in the luminescence in Approach ②, thereby reducing the proportion thereof.

In this embodiment, in addition to the function of sufficient receiving the holes from the HOMO energy level of the N-type organic semiconductor with its HOMO energy level, the carrier transporter also needs to have the function of transporting the electrons injected from the cathode to the LUMO of the N-type organic semiconductor. That is, the carrier transporter may transport both the holes and the electrons.

A bipolar carrier transport organic semiconductor may be used as the organic semiconductor having a HOMO energy level, which exhibits an energy level difference within ±0.3 eV with respect to the HOMO energy level of the N-type organic semiconductor. A bipolar carrier transport organic semiconductor is an organic semiconductor material which may provide sufficient transport for both electron carriers and hole carriers. Thus, the carrier transporter may be made from a single material, while the function of transporting both electrons and holes may be achieved.

In an embodiment, the bipolar carrier transport organic semiconductor may comprise both an electron donor unit and an electron acceptor unit to achieve the function of transporting electrons and holes. The examples of the electron donor unit include triphenylamines, carbazoles, etc. The examples of the electron acceptor unit include imidazoles, triazoles, etc.

Available examples of the bipolar carrier transport organic semiconductor include, but not limited to: CbzNBl, o-mCPBl, 4-CbzBiz, etc., with the molecular formulas as shown below.

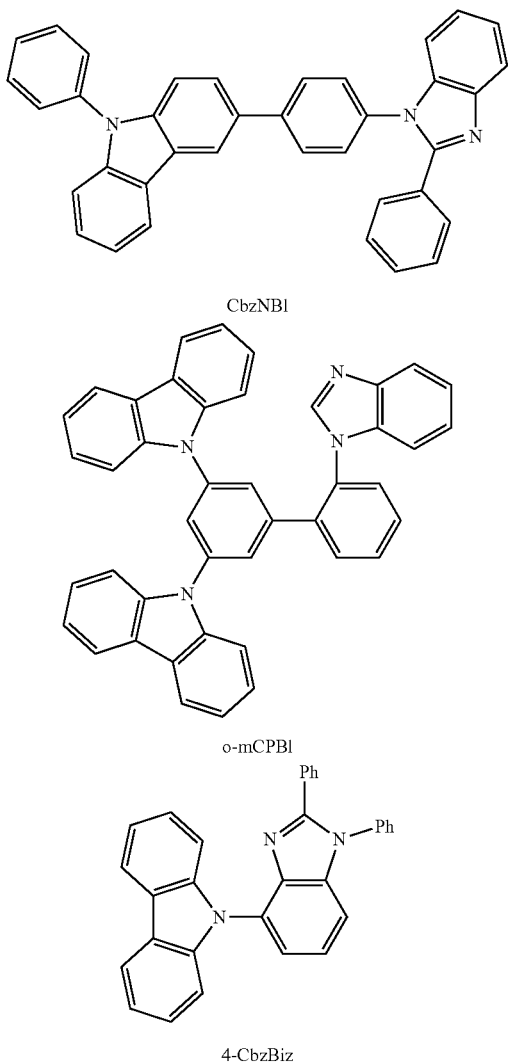 [SMILES: c1ccc(-c2nc3ccccc3n2-c2ccc(-c3ccc4c(c3)c3ccccc3n4-c3ccccc3)cc2)cc1 ; c1ccc(-n2cnc3ccccc32)c(-c2cc(-n3c4ccccc4c4ccccc43)cc(-n3c4ccccc4c4ccccc43)c2)c1 ; c1ccc(-c2nc3c(-n4c5ccccc5c5ccccc54)cccc3n2-c2ccccc2)cc1]

CbzNBl o-mCPBl

4-CbzBiz

The carrier transporters formed from these bipolar carrier transport organic semiconductors may be used cooperatively with the aforementioned electron transport material as the N-type organic semiconductor.

Figure 4A:
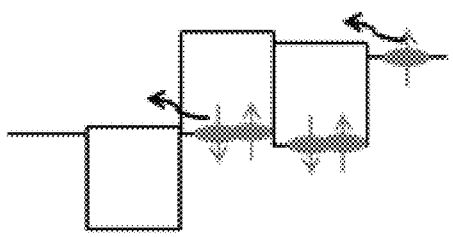
FIGS. 4A-4C show a luminescence mechanism according to yet another embodiment of the present disclosure.
Figure 4B:
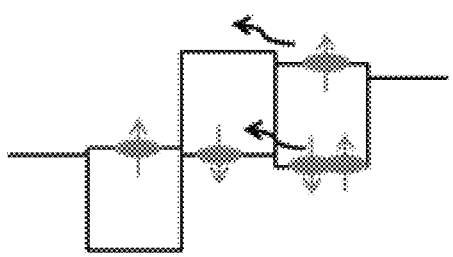
Figure 4C:
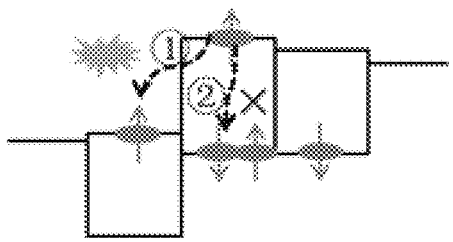

FIGS. 4A-4C show a luminescence mechanism according to yet another embodiment of the present disclosure, where a carrier transporter is provided between the N-type organic semiconductor and the cathode. The carrier transporter is formed from a bipolar carrier transport organic semiconductor, and the HOMO and LUMO energy levels are as shown in the figures. As shown in FIG. 4A, when a voltage is applied to the electroluminescent device for injecting electrons, the electrons are firstly injected into the LUMO energy level of the bipolar carrier transport organic semiconductor from the cathode, while the electrons in the HOMO energy level of the N-type organic semiconductor will migrate into the empty LUMO energy level of the P-type organic semiconductor. Subsequently, as shown in FIG. 4B, the electrons in the LUMO energy level of the bipolar carrier transport organic semiconductor will be injected into the LUMO energy level of the N-type organic semiconductor, while the holes in the HOMO energy level of the N-type organic semiconductor will migrate into the HOMO energy level of the bipolar carrier transport organic semiconductor, and the electrons are timely supplemented from the HOMO energy level of the bipolar carrier transport organic semiconductor. Finally, as shown in FIG. 4C, since in the HOMO energy level of the N-type organic semiconductor the holes are timely removed and the electrons are timely supplemented, the electrons injected into the LUMO energy level of the N-type organic semiconductor will be more inclined to transition in Approach ① rather than Approach ② to emit light. Thus, the proportion of the excitons in Approach ① is increased.

In other words, when the electrons in the HOMO energy level of the N-type organic semiconductor transit to the LUMO energy level of the P-type organic semiconductor, holes will be formed in the HOMO energy level of the N-type organic semiconductor. Since the HOMO energy level of the bipolar carrier is matched with the HOMO energy level of the N-type organic semiconductor, these holes may be timely removed. The concentration of the holes in the N-type organic semiconductor is significantly reduced, such that as many as possible of the electrons injected into the N-type organic semiconductor transit to the LUMO energy level of the adjacent P-type organic semiconductor (as indicated by Approach ① in FIG. 4C), thereby generating doublet excitons by recombination at the interface between two layers of materials and in turn, the excitons are de-excited and emit light radiatively. The transition from the LUMO energy level to the HOMO energy level in the N-type organic semiconductor will be significantly reduced (as indicated by the symbol x in Approach ② in FIG. 4C).

A hole transport organic semiconductor may also be used as the organic semiconductor having a HOMO energy level, which exhibits an energy level difference within ±0.3 eV with respect to the HOMO energy level of the N-type organic semiconductor. Since the electron carriers in the hole transport organic semiconductor are not enough, the problem of the electron transport from the cathode to the N-type organic semiconductor via the carrier transporter should be taken into consideration. One solution proposed in the present disclosure is to use a carrier transport layer with a thickness of 10 nm or less. When the thickness of the carrier transport layer is less than 10 nm, it is easy for electrons to pass through the carrier transport layer, so the effect of the hole transport organic semiconductor on the electron injection is small enough. Another solution is to mix the hole transport organic semiconductor with an electron transport material to form a carrier transporter capable of transporting both holes and electrons. More specifically, the hole transport organic semiconductor may be doped into an N-type semiconductor at a low concentration. When the carrier transporter is an N-type semiconductor doped with the hole transport organic semiconductor at a concentration of 5% or less, it may achieve the electron injection and transport at the cathode side.

Available examples of the hole transport organic semiconductor include, but not limited to:
  NPB(N,N'-diphenyl-N,N'-(1-naphyl)-1,1'-biphenyl-4,4'-diamine),
  TAPC(4,4'-cyclohexane-di [N,N-di(4-methylphenyeaniline]),
  TPD(N,N'-diphenyl-N,N'-di(3-methylphenyl)-1,1'-biphenyl-4,4'-diamine),
  TCTA(4,4',4"-tri(carbazol-9-yl)triphenylamine),
  p-TCTA(N,N'-diphenyl-N,N'-di(4-methylphenyl)-1,1'-biphenyl-4,4'-diamine),
  BCP(2,9-dimethyl-4,7-diphenyl-1,10-phenanthroline),
    etc., with the molecular formulas as shown below

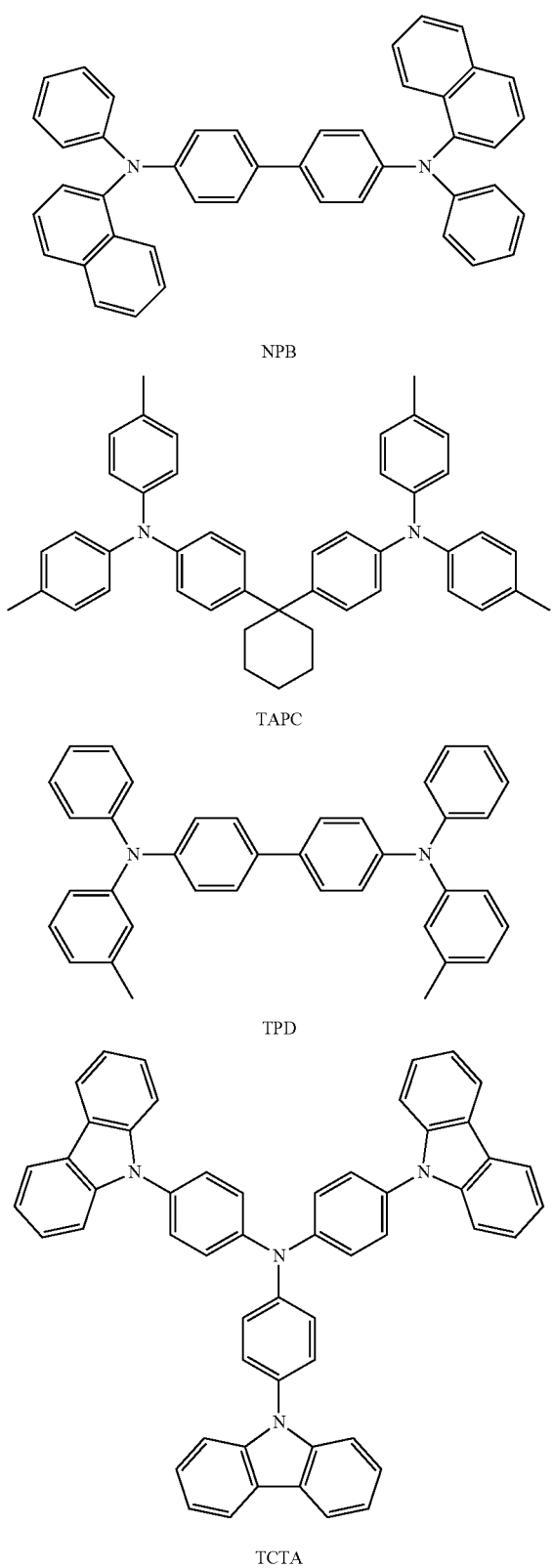

NPB

TAPC

TPD

TCTA

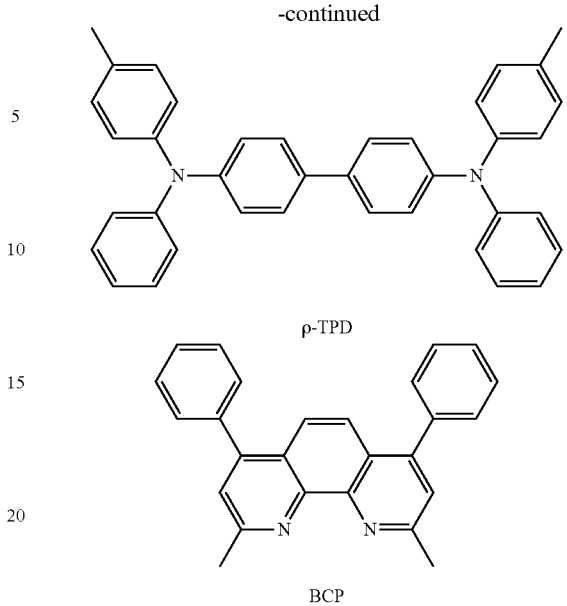

ρ-TPD

BCP

In the above-mentioned preferred embodiment, the increase in the proportion of the excitons in Approach ① is achieved by additionally providing a carrier transporter. When it is difficult to implement the combination of the HOMO energy level of the N-type organic semiconductor and the LUMO energy level of the P-type semiconductor layer having a great energy difference in the previous preferred embodiment due to the reason of, for example, materials, the proportion of the excitons in Approach ① may be increased by this preferred embodiment.

Of course, according to particular requirements, the above two embodiments which prevent the electron running off and facilitates the hole running off respectively may be used in combination.

Figure 5A:
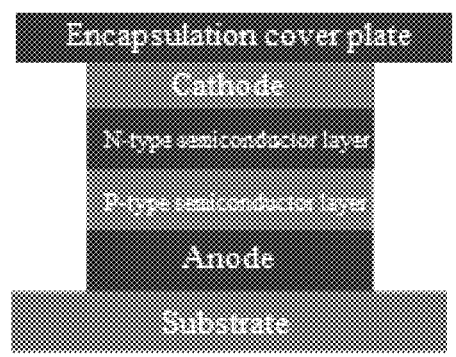
FIGS. 5A-5B show stack structures according to an embodiment of the present disclosure.
Figure 5B:
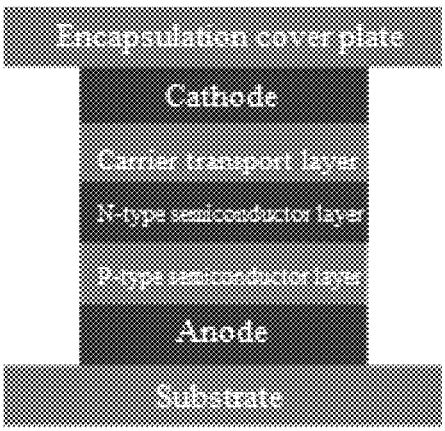

Various particular structure configurations may be used in the organic electroluminescent device of the present disclosure. Preferably, a stack structure typically in an electroluminescent device may be used. FIGS. 5A and 5B show two example devices with stack structures.

The present disclosure also provides a method for preparing the above-mentioned organic electroluminescent device, comprising:

fabricating the N-type organic semiconductor and the P-type organic semiconductor in contact with each other by a vacuum evaporation process, a spin coating process or an inkjet printing process.

Although the configuration of the device of the present disclosure may be achieved in various processes, a vacuum evaporation process, a spin coating process or an inkjet printing process is particularly suitable for achieving the combination of those two organic semiconductors. The method of the present disclosure further comprises steps of fabricating conventional components such as an anode and a cathode. The sequence for preparing various components may be adjusted according to particular requirements.

The organic electroluminescent device of the present disclosure may be used in various luminescence field, in particular in the display field. The present disclosure also provides a display panel comprising the organic electroluminescent device. The display panel may be provided with the organic electroluminescent device as appropriate, and achieve the display of at least a portion of the pixels or all the pixels in the panel by means of the luminescence thereof. The present disclosure also provides a display device comprising the display panel. In the display device, the organic electroluminescent device of the display panel is used as a light emitting component to achieve the display. The display device may comprise the above-mentioned display panel as a component. The present disclosure may also be used in a situation where the organic electroluminescent device may be used, for example, in a lighting device and so on.

Example 1: Preparation of an Organic Electroluminescent Device Prototype

An N-type organic semiconductor layer was formed from Alq3 on a surface of an Al electrode as the cathode. Subsequently, a HAT-CN layer was formed on the N-type organic semiconductor layer by an inkjet printing process. Finally, an ITO layer was deposited as the anode to form the electroluminescent device.

A voltage was applied to the electroluminescent device to achieve the luminescence. The wavelengths of the light emitted were measured. The wavelengths comprised an electron transition luminescence wavelength corresponding to an energy level difference between the LUMO energy level of Alq3 and the LUMO energy level of the HAT-CN.

Example 2: Preparation of an Organic Electroluminescent Device Prototype

The organic electroluminescent device model was prepared in the same process as in Example 1, except that TPBi was used in place of Alq3, F4-TCNQ was used in place of HAT-CN, and the Al electrode was covered by a bipolar carrier transporter, CbzNBl, before forming TpBi.

A voltage was applied to the electroluminescent device to achieve the luminescence. The wavelengths of the light emitted were measured. The wavelengths were essentially composed of an electron transition luminescence wavelength corresponding to an energy level difference between the LUMO energy level of TPBi and the LUMO energy level of the F4-TCNQ.

Example 3: Preparation of an Organic Electroluminescent Device Prototype

The organic electroluminescent device model was prepared in the same process as in Example 2, except that Bephen was used in place of TPBi, F2-HCNQ was used in place of F4-TCNQ, a hole transport organic semiconductor, TAPC, was used in place of CbzNBl, and the thickness of the TAPC layer was about 8 nm.

A voltage was applied to the electroluminescent device to achieve the luminescence. The wavelengths of the light emitted were measured. The wavelengths were essentially composed of an electron transition luminescence wavelength corresponding to an energy level difference between the LUMO energy level of Bephe and the LUMO energy level of the F2-HCNQ.

In the present disclosure, an organic semiconductor material having a low LUMO is used as a P-type semiconductor layer, and an organic material having an electron transport property is used as an N-type semiconductor layer. The P-type semiconductor layer and the N-type semiconductor layer together form a P-N junction device. The excitons recombine at the interface layer to emit light. By making use of the properties of very low HOMO and LUMO energy levels of the P-type semiconductor layer (its LUMO energy level is comparable to the HOMO energy level of a conventional electron transport N-type organic semiconductor), holes may be transported in its LUMO energy level. Since the LUMO energy level is not occupied by electrons, in the electroluminescent device, when the electrons transported from the cathode to the LUMO energy level of the N-type organic semiconductor layer transit to the LUMO energy level of the P-type semiconductor layer, they may be not limited by the spin statistics, and the internal quantum efficiency may be theoretically up to 100%, which significantly improves the luminescence efficiency of the device and reduces the power consumption of the device.

Obviously, modifications and variations on the embodiments of the present disclosure may be made by those skilled in the art without departing from the spirit and scope of the present application. As such, if these modifications and variations fall within the scopes of the claims of the present application or equivalents thereof, the present application is intended to encompass these modifications and variations.

What is claimed is:

1. An organic electroluminescent device comprising:
   a cathode;
   an anode;
   an N-type organic semiconductor between the cathode and the anode; and
   a P-type organic semiconductor between the N-type organic semiconductor and the anode and in contact with the N-type organic semiconductor,
   wherein the P-type organic semiconductor has a LUMO energy level between a LUMO energy level and a HOMO energy level of the N-type organic semiconductor, and an energy level difference between the LUMO energy level of the N-type organic semiconductor and the LUMO energy level of the P-type organic semiconductor corresponds to an electron transition luminescence spectral range in a wavelength range between near-infrared to ultraviolet,
   wherein the LUMO energy level of the N-type organic semiconductor is higher than the LUMO energy level of the P-type organic semiconductor by 1.6 eV or more.

2. The organic electroluminescent device according to claim 1, wherein the energy level difference between the LUMO energy level of the N-type organic semiconductor and the LUMO energy level of the P-type organic semiconductor corresponds to an electron transition luminescence spectral range in a wavelength range of visible light.

3. The organic electroluminescent device according to claim 1, wherein the LUMO energy level of the P-type organic semiconductor is in a range from −4.0 eV to −6.0 eV.

4. The organic electroluminescent device according to claim 1, wherein the P-type organic semiconductor is selected from: 2,3,6,7,10,11-hexacyano-1,4,5,8,9,12-hexaazabenzophenanthrene, 2,3,5,6-tetrafluoro-7,7',8,8'-tetracyanoquinodimethane, and 2,5-difluoro-3,6,7,7',8,8'-hexacyanoquinodimethane.

5. The organic electroluminescent device according to claim 1, wherein the HOMO energy level of the N-type organic semiconductor is lower than the LUMO energy level of the P-type organic semiconductor by 0.3 eV or more.

6. The organic electroluminescent device according to claim 1, wherein the organic electroluminescent device further comprises:
   a carrier transporter between the N-type organic semiconductor and the cathode and in contact with the N-type organic semiconductor, wherein the carrier transporter comprises an organic semiconductor having a HOMO energy level, which exhibits an energy level difference within ±0.3 eV with respect to the HOMO energy level of the N-type organic semiconductor.

7. The organic electroluminescent device according to claim 6, wherein the organic semiconductor having a HOMO energy level, which exhibits an energy level difference within ±0.3 eV with respect to the HOMO energy level of the N-type organic semiconductor, is a bipolar carrier transport organic semiconductor.

8. The organic electroluminescent device according to claim 7, wherein,
the bipolar carrier transport organic semiconductor comprises both an electron donor unit and an electron acceptor unit.

9. The organic electroluminescent device according to claim 6, wherein the organic semiconductor having a HOMO energy level, which exhibits an energy level difference within ±0.3 eV with respect to the HOMO energy level of the N-type organic semiconductor, is a hole transport organic semiconductor.

10. The organic electroluminescent device according to claim 9, wherein the carrier transporter is a carrier transport layer with a thickness of 10 nm or less.

11. The organic electroluminescent device according to claim 9, wherein the carrier transporter is an N-type semiconductor doped with the hole transport organic semiconductor at a concentration of 5% or less.

12. A method for preparing the organic electroluminescent device of claim 1, comprising
fabricating the N-type organic semiconductor and the P-type organic semiconductor in contact with each other by a vacuum evaporation process, a spin coating process or an inkjet printing process.

13. A display panel comprising the organic electroluminescent device of claim 1.

14. A display device comprising the display panel of claim 13.

15. An organic electroluminescent device comprising:
a cathode;
an anode;
an N-type organic semiconductor between the cathode and the anode; and
a P-type organic semiconductor between the N-type organic semiconductor and the anode and in contact with the N-type organic semiconductor,
wherein the P-type organic semiconductor has a LUMO energy level between a LUMO energy level and a HOMO energy level of the N-type organic semiconductor, and an energy level difference between the LUMO energy level of the N-type organic semiconductor and the LUMO energy level of the P-type organic semiconductor corresponds to an electron transition luminescence spectral range in a wavelength range between near-infrared to ultraviolet,
wherein the organic electroluminescent device further comprises:
a carrier transporter between the N-type organic semiconductor and the cathode and in contact with the N-type organic semiconductor, wherein the carrier transporter comprises an organic semiconductor having a HOMO energy level, which exhibits an energy level difference within ±0.3 eV with respect to the HOMO energy level of the N-type organic semiconductor.

16. The organic electroluminescent device according to claim 15, wherein the organic semiconductor having a HOMO energy level, which exhibits an energy level difference within ±0.3 eV with respect to the HOMO energy level of the N-type organic semiconductor, is a bipolar carrier transport organic semiconductor.

17. The organic electroluminescent device according to claim 16, wherein,
the bipolar carrier transport organic semiconductor comprises both an electron donor unit and an electron acceptor unit.

18. The organic electroluminescent device according to claim 15, wherein the organic semiconductor having a HOMO energy level, which exhibits an energy level difference within ±0.3 eV with respect to the HOMO energy level of the N-type organic semiconductor, is a hole transport organic semiconductor.

19. The organic electroluminescent device according to claim 18, wherein the carrier transporter is a carrier transport layer with a thickness of 10 nm or less, or wherein the carrier transporter is an N-type semiconductor doped with the hole transport organic semiconductor at a concentration of 5% or less.

* * * * *